United States Patent
Yamamoto et al.

(10) Patent No.: US 8,324,704 B2
(45) Date of Patent: Dec. 4, 2012

(54) SILICON CARBIDE SEMICONDUCTOR DEVICE WITH SCHOTTKY BARRIER DIODE AND METHOD OF MANUFACTURING THE SAME

(75) Inventors: Takeo Yamamoto, Nishikamo-gun (JP); Takeshi Endo, Toyota (JP); Eiichi Okuno, Mizuho (JP); Hirokazu Fujiwara, Nishikamo-gun (JP); Masaki Konishi, Toyota (JP); Takashi Katsuno, Nisshin (JP); Yukihiko Watanabe, Nagoya (JP)

(73) Assignees: DENSO CORPORATION, Kariya (JP); Toyota Jidosha Kabushiki Kaisha, Toyota-shi (JP)

( * ) Notice: Subject to any disclaimer, the term of this patent is extended or adjusted under 35 U.S.C. 154(b) by 200 days.

(21) Appl. No.: 12/659,853

(22) Filed: Mar. 23, 2010

(65) Prior Publication Data

US 2010/0244049 A1 Sep. 30, 2010

(30) Foreign Application Priority Data

Mar. 24, 2009 (JP) ................................. 2009-71827

(51) Int. Cl.
*H01L 29/24* (2006.01)
*H01L 29/47* (2006.01)
*H01L 21/04* (2006.01)

(52) U.S. Cl. .......... 257/473; 257/77; 257/155; 257/472; 257/476; 257/E29.104; 257/E29.148; 257/E21.062; 257/E21.064; 257/E21.055; 438/572; 438/573; 438/571; 438/582

(58) Field of Classification Search ............... 257/77, 257/155, 472, 473, 476, E29.104, E29.148, 257/E21.062, E21.064, E21.055; 438/571, 438/572, 573, 582
See application file for complete search history.

(56) References Cited

U.S. PATENT DOCUMENTS

| | | | | |
|---|---|---|---|---|
| 5,148,240 | A | * | 9/1992 | Ohtsuka et al. ............... 257/472 |
| 7,816,733 | B2 | * | 10/2010 | Okuno et al. ................. 257/339 |
| 7,851,881 | B1 | * | 12/2010 | Zhao et al. .................... 257/471 |
| 7,851,882 | B2 | * | 12/2010 | Okuno et al. ................. 257/472 |
| 7,863,682 | B2 | * | 1/2011 | Okuno et al. ................. 257/339 |
| 7,893,467 | B2 | * | 2/2011 | Yamamoto et al. ........... 257/280 |
| 7,915,705 | B2 | * | 3/2011 | Yamamoto et al. ........... 257/496 |
| 2004/0124435 | A1 | * | 7/2004 | D'Evelyn et al. ............. 257/103 |
| 2008/0277668 | A1 | * | 11/2008 | Okuno et al. ................... 257/77 |

(Continued)

FOREIGN PATENT DOCUMENTS

JP  A-2002-76372  3/2001

OTHER PUBLICATIONS

Office Action dated Apr. 4, 2012 issued in corresponding DE application No. 10 2010 002 798.7. (English translation attached).

*Primary Examiner* — Victor A Mandala
(74) *Attorney, Agent, or Firm* — Posz Law Group, PLC

(57) ABSTRACT

A silicon carbide semiconductor device with a Schottky barrier diode includes a first conductivity type silicon carbide substrate, a first conductivity type silicon carbide drift layer on a first surface of the substrate, a Schottky electrode forming a Schottky contact with the drift layer, and an ohmic electrode on a second surface of the substrate. The Schottky electrode includes an oxide layer in direct contact with the drift layer. The oxide layer is made of an oxide of molybdenum, titanium, nickel, or an alloy of at least two of these elements.

5 Claims, 5 Drawing Sheets

U.S. PATENT DOCUMENTS

| | | | |
|---|---|---|---|
| 2008/0277669 A1* | 11/2008 | Okuno et al. | 257/77 |
| 2008/0296587 A1* | 12/2008 | Yamamoto et al. | 257/77 |
| 2009/0008651 A1* | 1/2009 | Okuno et al. | 257/77 |
| 2009/0160008 A1* | 6/2009 | Fujiwara et al. | 257/471 |
| 2009/0243026 A1* | 10/2009 | Nakamura et al. | 257/471 |
| 2011/0037139 A1* | 2/2011 | Zhao et al. | 257/471 |

* cited by examiner

US 8,324,704 B2

SILICON CARBIDE SEMICONDUCTOR DEVICE WITH SCHOTTKY BARRIER DIODE AND METHOD OF MANUFACTURING THE SAME

CROSS REFERENCE TO RELATED APPLICATION

This application is based on and incorporates herein by reference Japanese Patent Application No. 2009-71827 filed on Mar. 24, 2009.

FIELD OF THE INVENTION

The present invention relates to a silicon carbide (SiC) semiconductor device with a Schottky barrier diode and relates to a method of manufacturing the silicon carbide semiconductor device.

BACKGROUND OF THE INVENTION

Conventionally, JP-2002-76372A discloses that a material for an electrode of a semiconductor device employing a silicon carbide substrate is selected so that device deterioration due to a high-temperature thermal treatment can be prevented. Specifically, according to JP-2002-76372, a Schottky electrode in direct contact with silicon carbide includes a carbide layer made of chrome, molybdenum, tungsten, or an alloy of these elements. Further, chrome, molybdenum, tungsten, or an alloy of these elements is formed on the carbide layer to reduce variations in device characteristics.

The carbide layer of the Schottky electrode defines an interface with silicon carbide. Due to a carbide layer, a barrier height at the interface cannot be controlled. Therefore, a reverse leak current may be increased.

SUMMARY OF THE INVENTION

In view of the above, it is an object of the present invention to provide a silicon carbide semiconductor device with a Schottky barrier diode for reducing a reverse leak current by controlling a barrier height. It is another object of the present invention to provide a method of manufacturing the silicon carbide semiconductor device.

According to an aspect of the present invention, a silicon carbide semiconductor device with a Schottky barrier diode includes a first conductivity type silicon carbide substrate, a first conductivity type silicon carbide drift layer on a first surface of the substrate, a Schottky electrode forming a Schottky contact with the drift layer, and an ohmic electrode on a second surface of the substrate. The Schottky electrode includes an oxide layer in direct contact with the drift layer. The oxide layer is made of an oxide of molybdenum, titanium, nickel, or an alloy of at least two of these elements.

According to another aspect of the present invention, a method of making a silicon carbide semiconductor device with a Schottky barrier diode includes preparing a first conductivity type silicon carbide substrate having a first surface and a second surface opposite to the first surface. The method further includes forming a first conductivity type silicon carbide drift layer on the first surface of the substrate in such a manner that an impurity concentration of the drift layer is less than an impurity concentration of the substrate. The method further includes forming a Schottky electrode on the drift layer in such a manner that the Schottky electrode forms a Schottky contact with a surface of the drift layer in a cell region of the drift layer. The method further includes forming an ohmic electrode on the second surface of the substrate. The Schottky electrode is formed by forming an oxide layer that is in direct contact with the surface of the drift layer. The oxide layer is made of an oxide of molybdenum, titanium, nickel, or an alloy of at least two of these elements.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
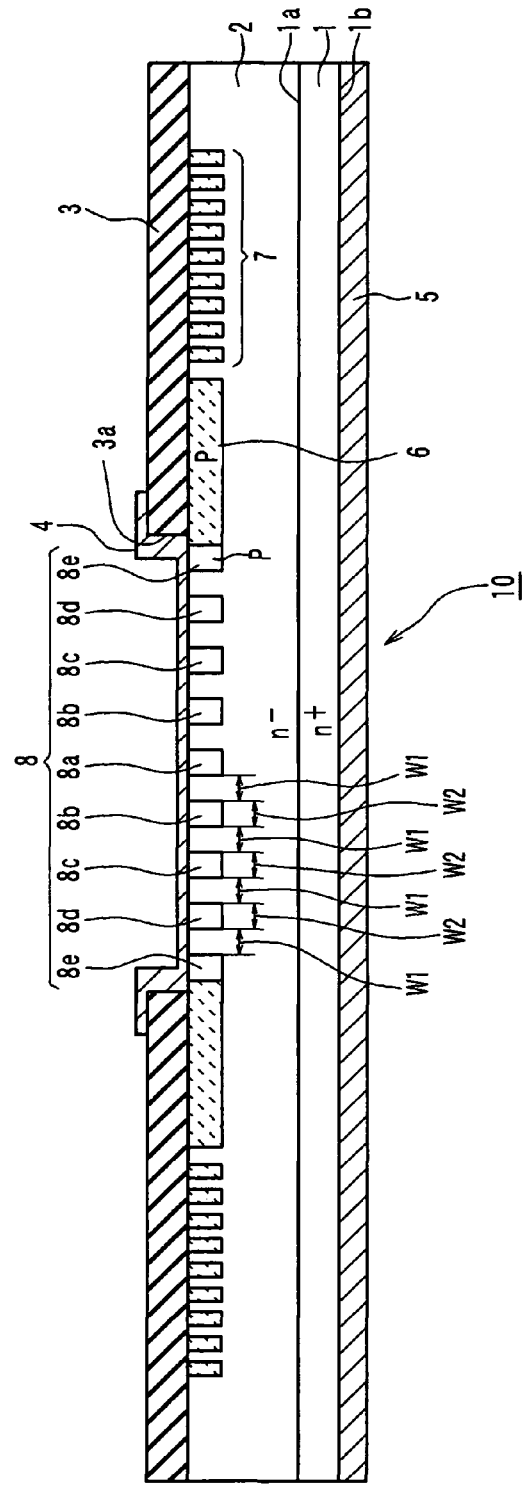
FIG. 1 is a diagram illustrating a cross-sectional view of a silicon carbide semiconductor device according to a first embodiment of the present invention.
Figure 2:
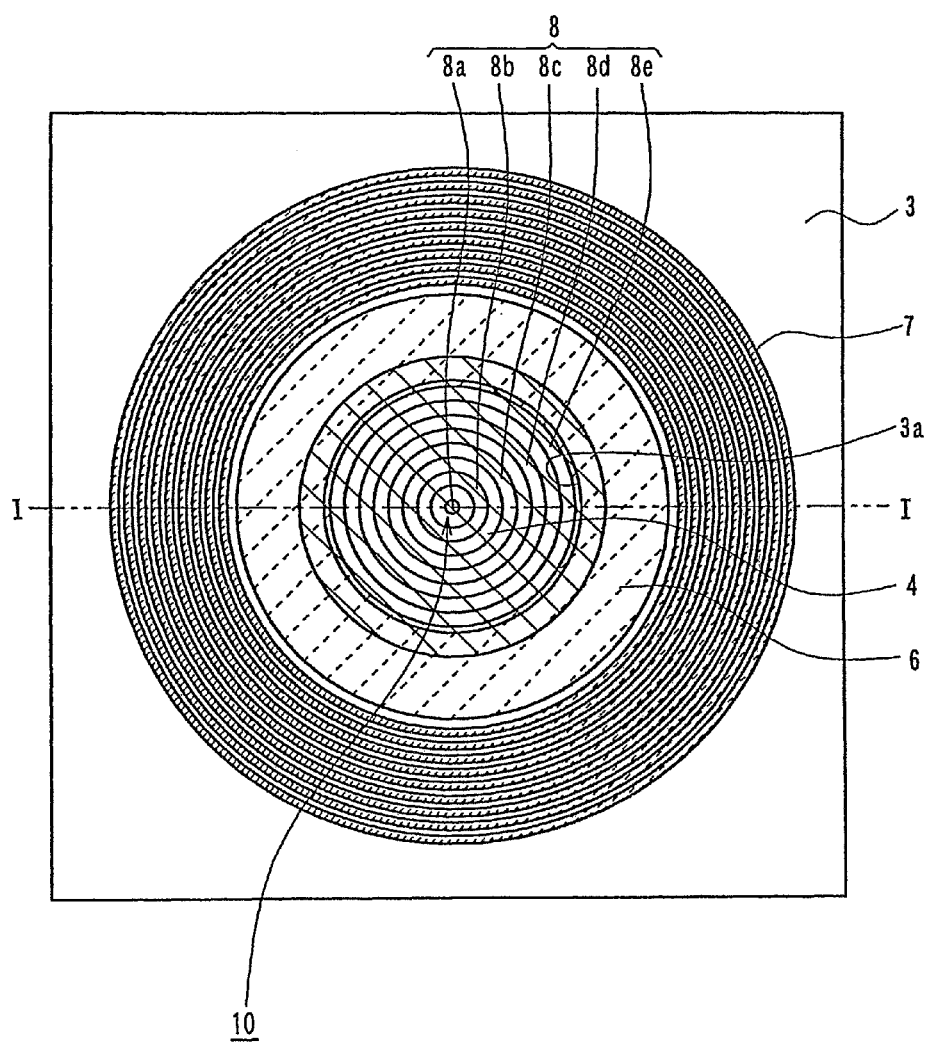
FIG. 2 is a diagram illustrating a top view of the silicon carbide semiconductor device of FIG. 1.

A silicon carbide semiconductor device according to a first embodiment of the present invention is discussed below with reference to FIGS. 1 and 2. FIG. 2 is a top view of the silicon carbide semiconductor device. FIG. 1 is a cross-sectional view taken along the line I-I in FIG. 2.

As shown in FIG. 1, the silicon carbide semiconductor device is formed with a $n^+$-type substrate 1 of silicon carbide. For example, an impurity concentration of the $n^+$-type substrate 1 can range from about $2\times10^{18}$ cm$^{-3}$ to about $1\times10^{21}$ cm$^{-3}$. The $n^+$-type substrate 1 has a first surface 1$a$ and a second surface 1$b$ opposite to the first surface 1$a$. A $n^-$-type drift layer 2 of silicon carbide is formed on the first surface 1$a$ of the $n^+$-type substrate 1. An impurity concentration of the $n^-$-type drift layer 2 is less than the impurity concentration of the $n^+$-type substrate 1. For example, the impurity concentration of the $n^-$-type drift layer 2 can be about $5\times10^{15}$ ($\pm50\%$) cm$^{-3}$. A Schottky barrier diode 10 is formed in a cell region of the $n^+$-type substrate 1 and the $n^-$-type drift layer 2. A termination structure is formed on the periphery of the Schottky barrier diode 10 so that the silicon carbide semiconductor device can be structured.

Specifically, an insulation film 3 such as a silicon oxide film is formed on a surface of the $n^-$-type drift layer 2. The insulation film 3 has an opening 3$a$ that is located corresponding to the cell region. A Schottky electrode 4 is in contact with the $n^-$-type drift layer 2 through the opening 3$a$. The Schottky electrode 4 is discussed in detail below with reference to FIG. 3.

Figure 3:
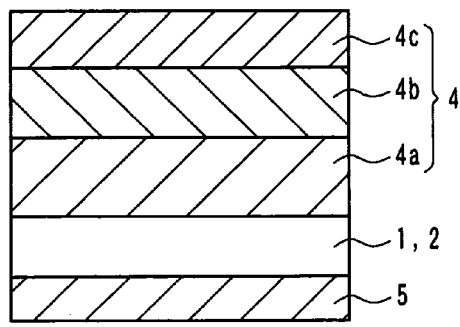
FIG. 3 is a diagram illustrating a Schottky electrode of the silicon carbide semiconductor device of FIG. 1.

FIG. 3 is a partially enlarged view of FIG. 1 and illustrates the Schottky electrode 4 in detail. As shown in FIG. 3, the Schottky electrode 4 includes an oxide layer 4a, a metal layer 4b, and an electrode layer 4c. The oxide layer 4a is in direct contact with silicon carbide and defines an interface between the n⁻-type drift layer 2 and the Schottky electrode 4. The oxide layer 4a is made of an oxide of molybdenum, titanium, nickel, or an alloy of at least two of these elements. The metal layer 4b is formed on the oxide layer 4a and made of molybdenum, titanium, nickel, or an alloy of at least two of these elements. It is noted that the metal layer 4b is made of the same metal element used in the oxide layer 4a. For example, when the oxide layer 4a is made of an oxide of molybdenum, the metal layer 4b is made of molybdenum. The electrode layer 4c is formed on the metal layer 4b. The silicon carbide semiconductor device can be electrically connected to external circuitry through the electrode layer 4c by wire-bonding or the like.

Figure 4:
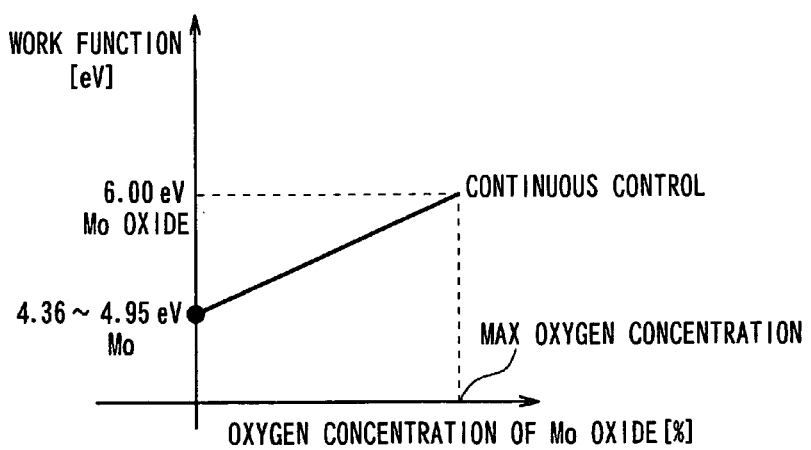
FIG. 4 is a graph illustrating a relationship between an average oxygen concentration and a work function when an oxide layer is made of molybdenum.

As described above, a portion of the Schottky electrode 4 in direct contact with silicon carbide is formed with the oxide layer 4a. In such an approach, a barrier height at the interface with silicon carbide is high compared to when the direct contact portion of the Schottky electrode 4 is made of a pure (i.e., not oxidized) metal element such as molybdenum, titanium, nickel, or an alloy of at least two of these elements. Therefore, a reverse leak current value can be reduced. It is noted that a value of the barrier height can be controlled by adjusting an average oxygen concentration It can be seen from FIG. 4 that the barrier height increases with an increase in the average oxygen concentration in the oxide layer 4a. That is, the barrier height depends on electron affinity of silicon carbide and the work function of the oxide layer 4a of the Schottky electrode 4. A work function of molybdenum ranges from about 4.36 eV to about 4.95 eV. A work function of an oxide of molybdenum is about 6.0 eV, when the oxygen concentration reaches its maximum value. The barrier height ranges from the work function of molybdenum to the work function of molybdenum oxide at the maximum oxygen concentration. Therefore, a desired barrier height can be obtained by adjusting the average oxygen concentration in the oxide layer 4a. Thus, desired electrical characteristics can be obtained by using the oxide layer 4a.

It is noted that the maximum oxygen concentration means a maximum value of oxygen content in a metal oxide that forms the oxide layer 4a. For example, a molybdenum oxide can exhibit multiple types of molecular structures represented by the following molecular formula: $MoO$, $MoO_2$, $MoO_3$, $Mo_2O_3$, and $Mo_2O_5$. When a molybdenum oxide maximally takes oxygen, the molybdenum oxide exhibit a molecular structure of $MoO_3$. Therefore, when all molybdenum oxides exhibit the molecular structure of $MoO_3$, the oxygen concentration reaches its maximum value. Although the oxygen concentration of the molybdenum oxide depends on the number of oxidized molecules, there is no need that all molybdenum oxides exhibit the molecular structure of $MoO_3$. The molecular structures of $MoO$, $MoO_2$, $MoO_3$, $Mo_2O_3$, $Mo_2O_5$, and $Mo_2O_5$ can be mixed. The oxygen concentration can be adjusted by adjusting the number of oxidized molecules and by mixing multiple types of molecular structures.

As mentioned previously, the metal layer 4b on the oxide layer 4a is made of the same metal element used in the oxide layer 4a. For example, the metal layer 4b is made of molybdenum, titanium, nickel, or an alloy of these elements. The electrode layer 4c can be made of a metal element different than that used in the oxide layer 4a. For example, the electrode layer 4c can be formed as a multilayer of a titanium layer and an aluminum layer. In this case, the electrode layer 4c can be tightly joined to the metal layer 4b as compared to when the electrode layer 4c is directly joined to the oxide layer 4a. Further, a contact resistance is reduced so that a forward voltage Vf can be reduced.

For example, a thickness of the oxide layer 4a can range from about 40 nm to about 50 nm, a total thickness of the oxide layer 4a and the metal layer 4b can be about 200 nm, a thickness of the titanium layer of the electrode layer 4c can be about 500 nm, and a thickness of the aluminum layer of the electrode layer 4c can be about 4000 nm.

As shown in FIG. 2, the opening 3a of the insulation film 3 has a circular shape. The Schottky electrode 4 forms a Schottky contact with the n⁻-type drift layer 2 through the circular opening 3a. As shown in FIG. 1, an ohmic electrode 5 is formed on the second surface 1b of the n⁺-type substrate 1 and in contact with the second surface 1b. For example, the ohmic electrode 5 can be made of nickel, titanium, tungsten, or molybdenum. The Schottky barrier diode 10 is formed in this way.

The termination structure on the periphery of the Schottky barrier diode 10 includes a p-type RESURF layer 6 and p-type guard ring layers 7. The p-type RESURF layer 6 is formed in a surface portion of the n⁻-type drift layer 2 and in contact with each end of the Schottky electrode 4. The p-type guard ring layers 7 are formed on the periphery of the p-type RESURF layer 6 so that the p-type RESURF layer 6 can be surrounded by the p-type guard ring layers 7. For example, the p-type RESURF layer 6 can be doped with aluminum with a concentration of from about $5\times10^{16}$ cm⁻³ to about $1\times10^{18}$ cm⁻³. Each of the p-type RESURF layer 6 and the p-type guard ring layers 7 has a circular ring shape to surround the cell region. Due to such a termination structure, an electric field spreads widely on the periphery of the Schottky barrier diode 10. Thus, an electric field concentration is reduced so that a resistance to breakdown can be improved.

Further, a p-type layer 8 is formed inside an inner periphery of the p-type RESURF layer 6 and in contact with the Schottky electrode 4. As shown in FIG. 2, the p-type layer 8 has a circular ring shape along the periphery of the cell region the periphery of the Schottky electrode 4). Specifically, the p-type layer 8 includes a center portion 8a and multiple (e.g., four) ring portions 8b-8e that are concentrically arranged around the center portion 8a. The ring portion 8e is located outermost of the p-type layer 8. The ring portion 8e is in contact with the inner periphery of the p-type RESURF layer 6 or included in the p-type RESURF layer 6. The ring portions 8b-8d are located between the center portion 8a and the outermost ring portion 8e and symmetrically arranged in a cross-section taken in a radial direction with respect to the center portion 8a. The center portion 8a and the ring portions 8b-8e are equally spaced at an interval W1. Each of the center portion 8a and the ring portions 8b-8e has the same width W2. For example, an impurity concentration of the p-type layer 8 can range from about $5\times10^{17}$ cm⁻³ to about $1\times10^{20}$ cm⁻³, the interval W1 can range from about 1.5 μm to 2.5 μm, the width W2 can range from about 1.0 μm to about 2.0 μm, and a thickness of the p-type layer 8 can range from about 0.3 μm to about 1.0 μm.

In the silicon carbide semiconductor device having the Schottky barrier diode 10, the Schottky electrode 4 serves as an anode, and the ohmic electrode 5 serves as a cathode. When a voltage exceeding a Schottky barrier is applied to the Schottky electrode 4, an electric current flows between the Schottky electrode 4 and the ohmic electrode 5.

During OFF of the Schottky barrier diode 10, a depletion layer extends from the p-type layer 8, which is located under the Schottky electrode 4, toward the n⁻-type drift layer 2. Therefore, the n⁻-type drift layer 2 sandwiched between the p-type layer 8 is completely depleted so that a leak current at the time of application of a reverse voltage can be reduced.

Below, a method of manufacturing the silicon carbide semiconductor device is discussed with reference to FIGS. 5A-5E. It is noted that the p-type guard ring layers 7 are omitted in FIGS. 5A-5E for simplicity.

Figure 5A:
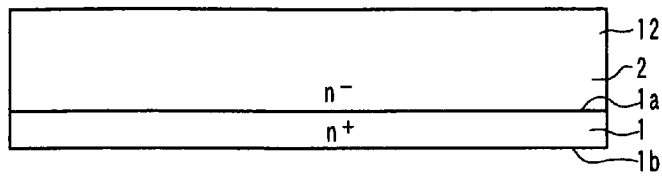
FIGS. 5A-5E are diagrams illustrating processes of a method of manufacturing the silicon carbide semiconductor device of FIG. 1.
Figure 5B:
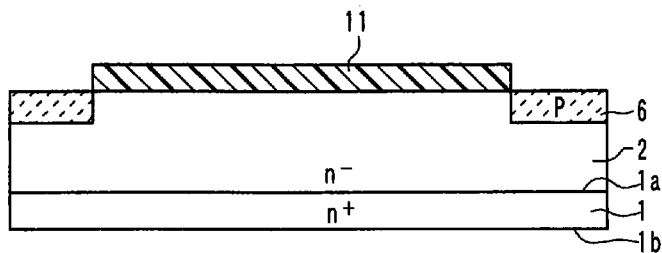

Firstly, in a process shown in FIG. 5A, the n⁻-type drift layer 2 is formed on the first surface 1a of the n⁺-type substrate by epitaxial growth. Next, in a process shown in FIG. 5B, a mask 11 is placed on the n⁻-type drift layer 2. For example, the mask 11 can be made of low-temperature oxide (LTO). Then, openings are formed in the mask 11 at positions corresponding to the p-type RESURF layer 6 and the p-type guard ring layers 7 by photolithography and etching. Then, ion implantation of p-type impurities such as Al is performed by using the mask 11. Then, activation is performed, for example, by thermal treatment so that the p-type RESURF layer 6 and the p-type guard ring layers 7 can be formed.

Figure 5C:
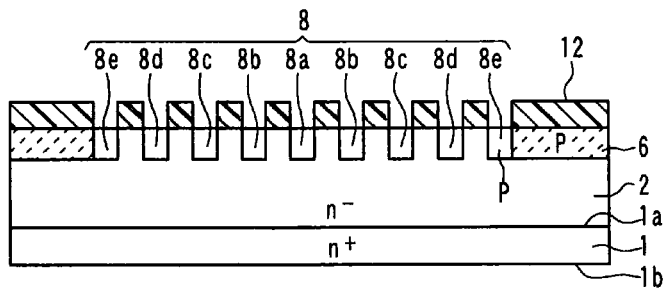
Figure 5D:
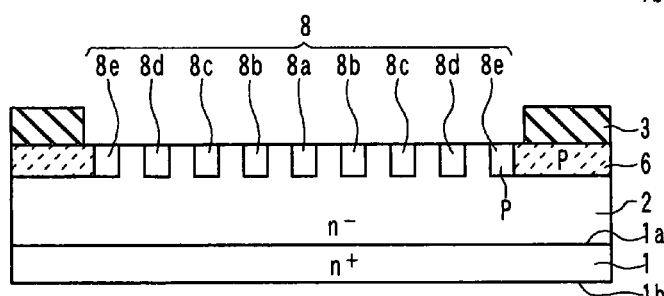

Next, in a process shown in FIG. 5C, the mask 11 is removed. Then, a new mask 12 is placed on the n⁻-type drift layer 2. For example, the mask 12 can be made of low-temperature oxide (LTO). Then, openings are formed in the mask 12 at positions corresponding to the p-type layer 8 by photolithography and etching. Then, ion implantation of p-type impurities such as Al is performed by using the mask 12. Then, activation is performed, for example, by thermal treatment so that the p-type layer 8 can be formed. Next, in a process shown in FIG. 5D, the mask 12 is removed. Then, a silicon oxide film is formed on the n⁻-type drift layer 2 by plasma CVD, for example. Then, a reflow process is performed so that the silicon oxide film can be formed into the insulation film 3. Next, the opening 3a is formed in the insulation film 3 by photolithography and etching.

Figure 5E:
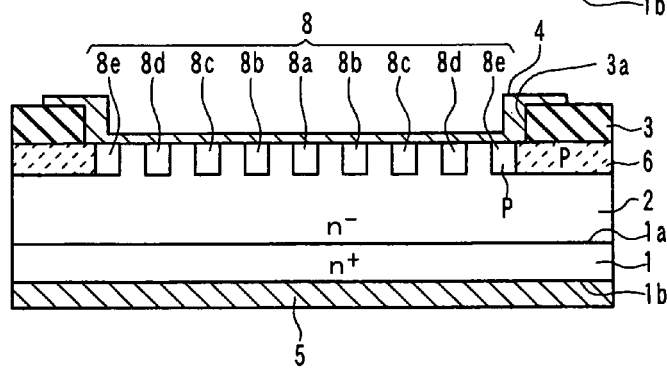

Then, in a process shown in FIG. 5E, the Schottky electrode 4 is formed on the insulation film 3 including the opening 3a. Specifically, a layer of molybdenum, titanium, nickel, or an alloy of at least two of these elements is evaporated in oxygen atmosphere in a chamber of a deposition equipment (not shown). Thus, the evaporated layer is oxidized during evaporation so that the oxide layer 4a can be formed. In this process, the average oxygen concentration in the oxide layer 4a can be controlled by adjusting evaporation temperature and/or the amount of oxygen gas introduced into the chamber. Thus, a desired barrier height at the interface with silicon carbide can be obtained.

In the above method, oxygen gas is introduced into the chamber to oxidize the evaporated layer. It is noted that oxygen gas is naturally produced in the chamber by heating the chamber to a high temperature. When a pure (i.e., not oxidized) metal layer is formed in the chamber, deposition is performed after discharging the produced oxygen gas from the chamber. The produced oxygen can be used to form the oxide layer 4a by not discharging the produced gas from chamber. In such an approach, there is no need to introduce oxygen gas into the chamber.

Then, the metal layer 4b is formed by continuing the deposition of the layer in the chamber. In this case, if the oxide layer 4a is formed by using the introduced oxygen gas, the metal layer 4b can be formed by stopping the introduction of oxygen gas into the chamber. In contrast, if the oxide layer 4a is formed by using the naturally produced oxygen gas, the metal layer 4b can be formed by simply continuing the deposition of the layer because of the fact that all the produced oxygen gas gets used up to form the oxide layer 4a. In this way, an oxygen concentration in the metal layer 4b can be zero or negligible.

Since the oxide layer 4a and the metal layer 4b are successively formed by using the same type of metal, there may be no clear boundary between the oxide layer 4a and the metal layer 4b. It is noted that the barrier height depends on the average oxygen concentration at an interface between the oxide layer 4a and silicon carbide. Therefore, the average oxygen concentration in the oxide layer 4a can vary in the thickness direction of the oxide layer 4a, as long as the average oxygen concentration at the interface has a predetermined value.

Then, the electrode layer 4c is formed on the metal layer 4b. For example, the electrode layer 4c can be formed as a multilayer of a titanium layer and an aluminum layer. The electrode layer 4c can be formed by the same deposition equipment used to form the oxide layer 4a and the metal layer 4b. Alternatively, the electrode layer 4c can be formed by a deposition equipment different from that used to form the oxide layer 4a and the metal layer 4b. Then, the Schottky electrode 4 is formed by patterning the oxide layer 4a, the metal layer 4b, and the electrode layer 4c. Further, a metal layer of nickel, titanium, tungsten, molybdenum, or the like is formed on the second surface 1b of the n⁺-type substrate 1 so that the ohmic electrode 5 can be formed. Thus, the silicon carbide semiconductor device shown in FIG. 1 is completed.

As described above, according to the first embodiment, the Schottky electrode 4 is in direct contact with silicon carbide at the oxide layer 4a. In such an approach, the barrier height between the Schottky electrode 4 and silicon carbide can be increased so that the reverse leak current can be reduced. Further, the value of the barrier height can be controlled by adjusting the average oxygen concentration [wt %] in the oxide layer 4a. Therefore, the value of the reverse leak current can be controlled by controlling the value of the barrier height.

Further, according to the first embodiment, the metal layer 4b made of the same metal element used in the oxide layer 4a is formed on the metal layer 4b. In such an approach, even when the electrode layer 4c is made of a metal element different than that used in the oxide layer 4a, the electrode layer 4c can be tightly joined to the metal layer 4b as compared to when the electrode layer 4c is directly joined to the oxide layer 4a. Further, a contact resistance is reduced so that a forward voltage Vf can be reduced.

Second Embodiment

A silicon carbide semiconductor device according to a second embodiment of the present invention is discussed with reference to FIG. 6. A difference between the first embodiment and the second embodiment is the structure of the Schottky electrode 4 of the Schottky barrier diode 10.

Figure 6:
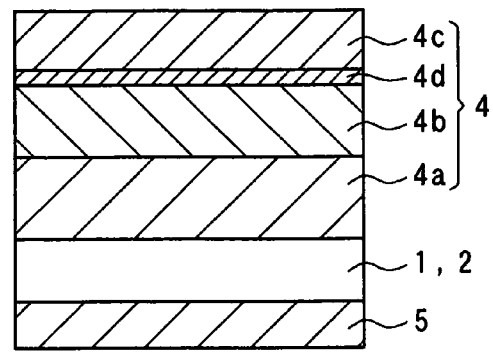
FIG. 6 is a diagram illustrating a cross-sectional view of a Schottky electrode of a silicon carbide semiconductor device according to a second embodiment of the present invention.

FIG. 6 is a cross-sectional view of a Schottky electrode 4 of the second embodiment. As can be send from FIG. 6, the Schottky electrode 4 includes a cap layer 4d in addition to the oxide layer 4a, the metal layer 4b, and the electrode layer 4c. The cap layer 4d is formed on the metal layer 4b. The electrode layer 4c is formed on the cap layer 4d. The cap layer 4d is made of a metal having a higher resistance to oxidation than a metal of which the metal layer 4b is made. That is, the cap layer 4d is made of a metal having a higher resistance to oxidation than molybdenum, titanium, nickel, or an alloy of at least two of these elements. For example, when the metal layer 4b is made of molybdenum, the cap layer 4d can be made of tungsten, nickel, or the like.

In this way, the metal layer 4b is covered with the cap layer 4d which has high resistance to oxidation. The cap layer 4d prevents oxygen in treatment atmosphere from entering the metal layer 4b during thermal treatment such as annealing treatment. Thus, the metal layer 4b can be protected from oxidation. Processes for making the Schottky electrode 4 of the second embodiment are discussed below with reference to FIGS. 7A and 7B. It is noted that the other processes are the same between the first and second embodiments.

Figure 7A:
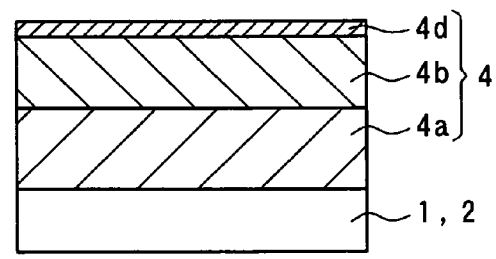
FIGS. 7A, 7B are diagrams illustrating processes of a method of manufacturing the Schottky electrode of FIG. 6.
Figure 7B:
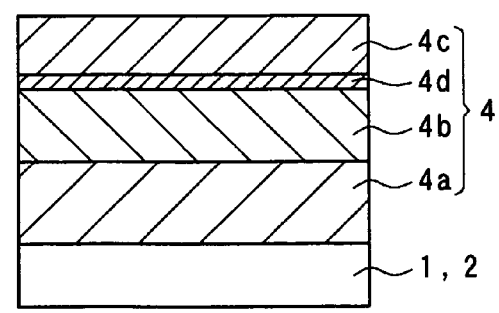

The process shown in FIG. 7A is performed, after the oxide layer 4a and the metal layer 4b are formed in the process shown in FIG. 5E. In the process shown in FIG. 7A, the cap layer 4d is formed on the metal layer 4b by using tungsten, nickel, or the like, so that the metal layer 4b can be covered with the cap layer 4d. Under this condition, an annealing treatment is performed at a high temperature of 800° C., for example. Then, in the process shown in FIG. 7B, the electrode layer 4c is formed on the cap layer 4d. Since the annealing treatment is performed under the condition that the metal layer 4b is covered with the cap layer 4d, it is possible to prevent oxygen produced in a chamber of an annealing equipment from entering the metal layer 4b. Thus, the metal layer 4b can be protected from oxidation. For example, assuming that the electrode layer 4c is made of aluminum, the electrode layer 4c can be melt during the annealing treatment due to its low melting temperature. Therefore, it is needed to perform the annealing treatment before forming the electrode layer 4c. If there is no cap layer 4d, the metal layer 4b may be exposed to oxygen and oxidized during the annealing treatment.

As describe above, according to the second embodiment, the metal layer 4b is covered with the cap layer 4d having a higher resistance to oxidation than the metal layer 4b. The annealing treatment is performed under the condition that the metal layer 4b is covered with the cap layer 4d. In such an approach, the metal layer 4b can be protected from oxidation during the manufacturing processes of the semiconductor device. Further, since the metal layer 4b remains covered with the cap layer, the metal layer 4b can remain protected from oxidation after the manufacture of the semiconductor device.

Modifications

The embodiments described above can be modified in various ways, for example, as follows.

In the embodiments, the oxide layer 4a is formed by evaporating a layer of molybdenum, titanium, nickel, or an alloy of at least two of these elements in oxygen atmosphere while adjusting the average oxygen concentration in the oxide layer 4a. This is only an example of a method of making the oxide layer 4a. For example, the average oxygen concentration in the oxide layer 4a can be adjusted by thermally treating the oxide layer 4a after the oxide layer 4a is formed. For another example, the oxide layer 4a can be formed by evaporating a layer of molybdenum, titanium, nickel, or an alloy of at least two of these elements and by oxidizing the layer by thermal treatment.

Like the first embodiment, in a case where the metal layer 4b is not covered with the cap layer 4d, the annealing treatment can be performed so as to increase the average oxygen concentration in the oxide layer 4a.

The Schottky barrier diode 10 can include at least the $n^+$-type substrate 1, the $n^-$-type drift layer 2, the Schottky electrode 4, and the ohmic electrode 5.

In the embodiments, a n-type is defined as a first conductivity type, and a p-type is defined as a second conductivity type. Alternatively, a n-type can be defined as a second conductivity type, and a p-type can be defined as a first conductivity type.

Such changes and modifications are to be understood as being within the scope of the present invention as defined by the appended claims.

What is claimed is:

1. A silicon carbide semiconductor device with a Schottky barrier diode, the silicon carbide semiconductor device comprising:
   a first conductivity type silicon carbide substrate having a first surface and a second surface opposite to the first surface;
   a first conductivity type silicon carbide drift layer on the first surface of the substrate, the drift layer having an impurity concentration less than an impurity concentration of the substrate;
   a Schottky electrode on the drift layer, the Schottky electrode forming a Schottky contact with a surface of the drift layer in a cell region of the drift layer; and
   an ohmic electrode on the second surface of the substrate, wherein
   the Schottky electrode includes an oxide layer that is in direct contact with the surface of the drift layer and made of an oxide of a first metal,
   the first metal is molybdenum, titanium, nickel, or an alloy of at least two of these elements,
   the Schottky electrode further includes a metal layer on the oxide layer and an electrode layer on the metal layer,
   the metal layer is made of a second metal,
   the second metal is the same as the first metal,
   the Schottky electrode further includes a cap layer located between the metal layer and the electrode layer, and
   the cap layer is made of a fourth metal having a higher resistance to oxidation than the second metal.

2. A method of manufacturing a silicon carbide semiconductor device with a Schottky barrier diode, the method comprising:
   preparing a first conductivity type silicon carbide substrate having a first surface and a second surface opposite to the first surface;
   forming a first conductivity type silicon carbide drift layer on the first surface of the substrate in such a manner that an impurity concentration of the drift layer is less than an impurity concentration of the substrate;
   forming a Schottky electrode on the drift layer in such a manner that the Schottky electrode forms a Schottky contact with a surface of the drift layer in a cell region of the drift layer; and
   forming an ohmic electrode on the second surface of the substrate, wherein
   forming the Schottky electrode includes forming an oxide layer of an oxide of a first metal in such a manner that the oxide layer is in direct contact with the surface of the drift layer,
   the first metal is molybdenum, titanium, nickel, or an alloy of at least two of these elements, and
   forming the oxide layer includes controlling a barrier height between the drift layer and the oxide layer by adjusting an average oxygen concentration in the oxide layer.

3. A method of manufacturing a silicon carbide semiconductor device with a Schottky barrier diode, the method comprising:
   preparing a first conductivity type silicon carbide substrate having a first surface and a second surface opposite to the first surface;
   forming a first conductivity type silicon carbide drift layer on the first surface of the substrate in such a manner that an impurity concentration of the drift layer is less than an impurity concentration of the substrate;

forming a Schottky electrode on the drift layer in such a manner that the Schottky electrode forms a Schottky contact with a surface of the drift layer in a cell region of the drift layer; and forming an ohmic electrode on the second surface of the substrate, wherein forming the Schottky electrode includes forming an oxide layer of an oxide of a first metal in such a manner that the oxide layer is in direct contact with the surface of the drift layer, the first metal is molybdenum, titanium, nickel, or an alloy of at least two of these elements, and forming the oxide layer includes forming a layer of the first metal in oxygen atmosphere or oxidizing a layer of the first metal by thermal treatment after forming the layer of the first metal.

4. A method of manufacturing a silicon carbide semiconductor device with a Schottky barrier diode, the method comprising:

preparing a first conductivity type silicon carbide substrate having a first surface and a second surface opposite to the first surface;

forming a first conductivity type silicon carbide drift layer on the first surface of the substrate in such a manner that an impurity concentration of the drift layer is less than an impurity concentration of the substrate;

forming a Schottky electrode on the drift layer in such a manner that the Schottky electrode forms a Schottky contact with a surface of the drift layer in a cell region of the drift layer; and forming an ohmic electrode on the second surface of the substrate, wherein forming the Schottky electrode includes forming an oxide layer of an oxide of a first metal in such a manner that the oxide layer is in direct contact with the surface of the drift layer, the first metal is molybdenum, titanium, nickel, or an alloy of at least two of these elements, and forming the oxide layer includes forming a layer of the first metal in oxygen atmosphere, and adjusting the average oxygen concentration in the oxide layer includes thermally treating the oxide layer.

5. A method of manufacturing a silicon carbide semiconductor device with a Schottky barrier diode, the method comprising:

preparing a first conductivity type silicon carbide substrate having a first surface and a second surface opposite to the first surface;

forming a first conductivity type silicon carbide drift layer on the first surface of the substrate in such a manner that an impurity concentration of the drift layer is less than an impurity concentration of the substrate;

forming a Schottky electrode on the drift layer in such a manner that the Schottky electrode forms a Schottky contact with a surface of the drift layer in a cell region of the drift layer; and forming an ohmic electrode on the second surface of the substrate, wherein forming the Schottky electrode includes forming an oxide layer of an oxide of a first metal in such a manner that the oxide layer is in direct contact with the surface of the drift layer, the first metal is molybdenum, titanium, nickel, or an alloy of at least two of these elements, forming the Schottky electrode includes forming a metal layer of a second metal on the oxide layer and forming an electrode layer on the metal layer, the second metal is the same as the first metal, forming the Schottky electrode includes forming a cap layer of a third metal on the metal layer and performing thermal treatment under a condition that the metal layer is covered with the cap layer, forming the electrode layer is performed after performing the thermal treatment, and the third metal has a higher resistance to oxidation than the second metal.

* * * * *